(12) United States Patent
Vaccaro

(10) Patent No.: US 6,534,838 B1
(45) Date of Patent: Mar. 18, 2003

(54) SEMICONDUCTOR DEVICE AND METHOD OF FABRICATING THE SAME

(75) Inventor: Pablo O. Vaccaro, Kyoto (JP)

(73) Assignee: ATR Advanced Telecommunications Research Institute International, Kyoto (JP)

( * ) Notice: Subject to any disclaimer, the term of this patent is extended or adjusted under 35 U.S.C. 154(b) by 0 days.

(21) Appl. No.: 09/947,389

(22) Filed: Sep. 7, 2001

(51) Int. Cl.[7] ............................................. H01L 29/82
(52) U.S. Cl. ................. 257/415; 257/418; 257/419; 257/420; 257/432; 257/436; 438/31; 438/32; 438/42; 438/46; 385/131; 313/499
(58) Field of Search ............................ 257/79, 80, 81, 257/618, 622, 628, 82; 438/31, 32, 42, 46, 47; 385/131; 313/499

(56) References Cited

U.S. PATENT DOCUMENTS 5,023,503 A * 6/1991 Legge et al. ................. 310/311
5,613,022 A * 3/1997 Odhner et al. ................. 385/37

OTHER PUBLICATIONS

Resonant Microscanneres for Laser Scanning & Displays, Oct., 1966.
Micromachined Movable Microreflectors.
Actuated Micromirrors for External–Cavity Semiconductor Lasers, Sep., 1995.
"Strain–driven Self–positioning of Micromachined Structures," Appl. Phys. Lett., 78, (19), 2852, (2001).
Nature, vol. 411, May 17, 2001, www.nature.com.

* cited by examiner

*Primary Examiner*—Olik Chaudhuri
*Assistant Examiner*—Wai-Sing Louie
(74) *Attorney, Agent, or Firm*—Armstrong, Westerman & Hattori, LLP.

(57) ABSTRACT

A release layer composed of AlGaAs, a strain layer, a strain compensation layer composed of an InGaAs, and a component layer are formed on a GaAs substrate. The component layer includes a DBR film. A recess for defining a bent region is formed in the component layer. The component layer, the strain compensation layer, the strain layer, and the release layer are removed in an approximately U shape, thereby forming a groove. The release layer under the strain layer is selectively removed. The strain layer is bent at a region below the recess so as to relax strain caused by the difference in the lattice constant between the InGaAs layer and the GaAs layer, and the component layer stands perpendicularly to the GaAs substrate.

13 Claims, 8 Drawing Sheets

F I G. 4
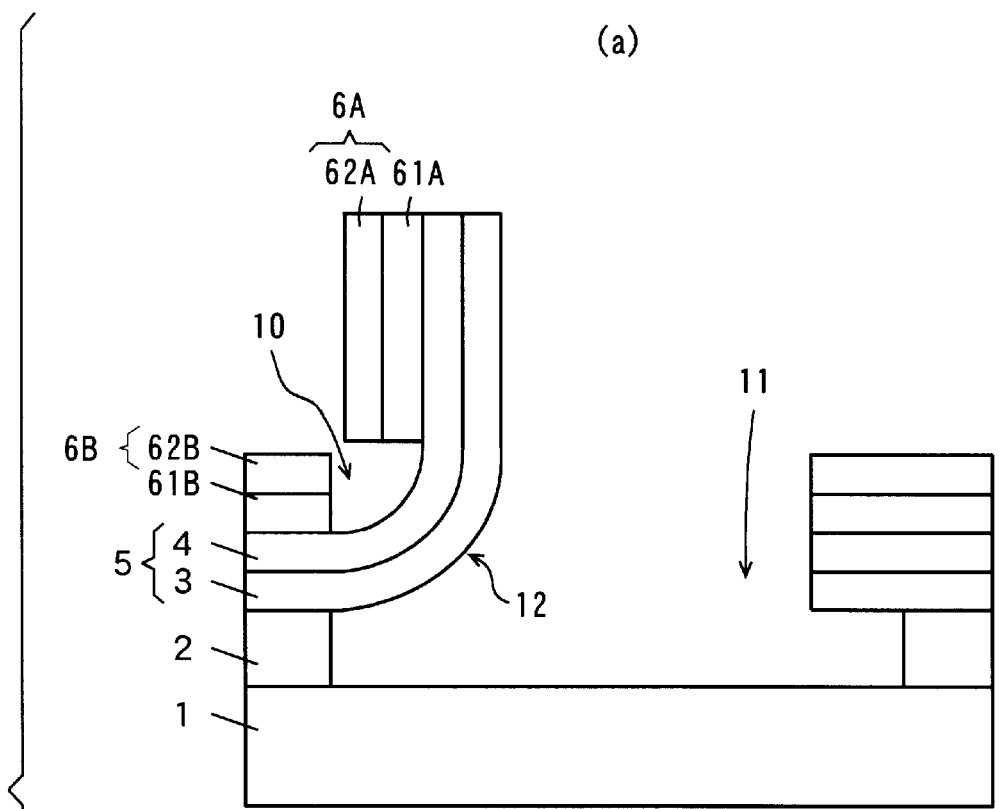
(a)
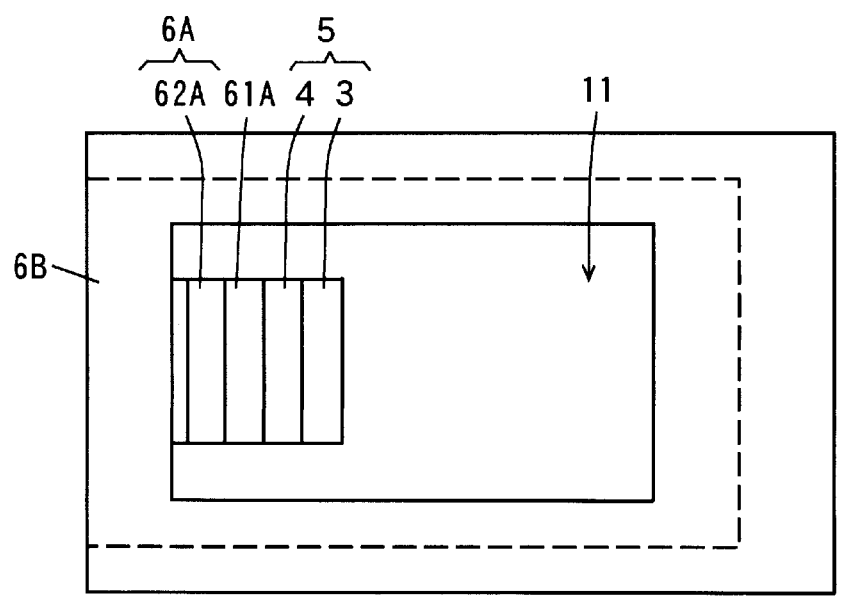
(b)

(a)

(b)

SEMICONDUCTOR DEVICE AND METHOD OF FABRICATING THE SAME

BACKGROUND OF THE INVENTION

1. Field of the Invention

The present invention relates to a semiconductor device having a standing structure of a semiconductor layer and a method of fabricating the same.

2. Description of the Background Art

Micro-optical benches with standing structure are realized by micro-machining technology using silicon. It is reported that resonant micro scanners for laser scanning display, movable micro reflectors, and scanning micro mirrors for external resonators of semiconductor lasers, for example, are fabricated using the micro-machining technology.

In the conventional micro-machining technology, a part of a laminated semiconductor layer is stripped by etching, the stripped part is slid to stand and is joined by a hinge, to form a standing structure. A mirror or the like standing at a predetermined angle is constructed on a substrate using the standing structure.

When the standing structure is produced by a semiconductor using the conventional micro-machining technology, however, wear occurs in sliding the stripped semiconductor layer. Further, sliding the semiconductor layer to a predetermined position requires manual operations or complex electrostatic engines. Therefore, the micro-machining technology is more complex and is inferior in workability.

SUMMARY OF THE INVENTION

An object of the present invention is to provide a semiconductor device capable of self-assemble during the fabrication process and of accurately controlling the angle and the position of each of members constituting a standing structure as well as being easily comprised of a semiconductor layer and a method of fabricating the same.

A semiconductor device according to an aspect of the present invention comprises a substrate, a first layer, a second layer, and a third layer in this order, the second layer including a stacked structure of a first semiconductor layer having a first lattice constant and a second semiconductor layer having a second lattice constant smaller than the first lattice constant, the third layer, the second layer and the first layer in a region surrounding a predetermined region of the third layer, excluding a partial region, being removed, the first layer in the predetermined region and the partial region being removed, and the second layer in the predetermined region being bent at the partial region.

In the semiconductor device, the third layer, the second layer and the first layer region in the region surrounding the redetermined region, excluding the partial, are removed, and the first layer in the predetermined region and the partial region are removed. Accordingly, the second layer in the predetermined region is in a released state while being linked to the surrounding region only in the partial region. Since the lattice constant of the first semiconductor layer in the second layer is larger than the lattice constant of the second semiconductor layer, strain based on the difference in the lattice constant is induced in the second layer. Consequently, the second layer is bent so as to relax the strain. As the second layer is bent, the third layer on the second layer stands at a predetermined angle to the substrate.

The second layer is automatically bent so as to relax the strain caused by the difference in the lattice constant between the first semiconductor layer and the second semiconductor layer, whereby the third layer stands on the substrate. Therefore, the angle of the third layer can be easily and accurately controlled by adjusting compositions and the thicknesses of the first semiconductor layer and the second semiconductor layer.

Consequently, a semiconductor device capable of accurately controlling the angle and the position of each of the members constituting the standing structure as well as being easily comprised of a semiconductor layer is realized.

The third layer in the partial region may be removed. Consequently, the second layer can be easily bent at the partial region.

The third layer may include a third semiconductor layer having a lattice constant approximately equal to that of the first semiconductor layer in the second layer. In the case, the third layer is prevented from being curved, thereby forming a flat third layer standing on the substrate.

The third layer may include a third semiconductor layer having a lattice constant different from that of the first semiconductor layer in the second layer. In the case, the third layer is curved, thereby forming a third layer in the shape of a cylindrical surface standing on the substrate.

The third layer on the second layer, in the predetermined region, bent at the partial region may have a flat surface. In the case, the flat third layer standing on the substrate is formed.

The third layer on the second layer, in the predetermined region, bent at the partial region may have a cylindrical surface. In this case, the third layer in the shape of a cylindrical surface standing on the substrate is formed.

The predetermined region may include a plurality of regions, the parts of the second layer respectively bent in the plurality of regions or the parts of the third layer on the parts of the second layer may be abutted against each other.

In this case, the plurality of parts of second layer or the plurality of parts of third layer are abutted against each other, whereby the angle of each of the parts of the third layer is defined. Accordingly, the angle of each of the parts of the third layer can be accurately set to a desired angle without precisely controlling the compositions and the thicknesses of the first semiconductor layer and the second semiconductor layer.

The third layer may include a reflective film. In this case, a mirror standing on the substrate can be constructed.

The first layer may be a release layer, the second layer may be a strain layer, and the third layer may include a component layer.

A semiconductor device according to another aspect of the present invention comprises a substrate, a first layer, a second layer, and a third layer in this order, the second layer including a stacked structure of a first semiconductor layer having a first lattice constant and a second semiconductor layer having a second lattice constant smaller than the first lattice constant, the third layer, the second layer and the first layer in regions respectively surrounding a plurality of predetermined regions of the third layer, excluding partial regions, being removed, the first layer in the plurality of predetermined regions and the respective partial regions being removed, and the second layer in the plurality of predetermined regions being bent at the respective partial regions.

In the semiconductor device, the third layer, the second layer and the first layer in the regions surrounding the plurality of predetermined regions, excluding the respective partial regions, are removed, and the first layer in the plurality of predetermined regions and the respective partial regions is removed. Accordingly, the parts of the second layer in the plurality of predetermined regions are in a released state while being linked to the surrounding regions only in the respective partial regions. Since the lattice constant of the first semiconductor layer in the second layer is larger than the lattice constant of the second semiconductor layer, strain based on the difference in the lattice constant is induced in the second layer. Consequently, the parts of the second layer are bent so as to relax the strain. As the parts of the second layer are bent, the parts of the third layer on the parts of the second layer stand at a predetermined angle to the substrate in the plurality of predetermined regions.

The parts of the second layers are automatically bent in the plurality of predetermined regions so as to relax the strain caused by the difference in the lattice constant between the first semiconductor layer and the second semiconductor layer, whereby the parts of the third layer stand on the substrate in the plurality of predetermined regions. Therefore, the angle of the parts of the third layer in the plurality of predetermined regions can be easily and accurately controlled by adjusting the compositions and the thicknesses of the first semiconductor layer and the second semiconductor layer.

Consequently, a semiconductor device capable of accurately controlling the angle and the position of each of members constituting the plurality of standing structures as well as being easily comprised of a semiconductor layer is realized.

The third layer in the respective partial regions may be removed. Consequently, the parts of the second layer can be easily bent in the partial regions.

The parts of the second layer, in the plurality of predetermined regions, bent at the respective partial regions or the parts of the third layer on the parts of the second layer may be abutted against each other.

In this case, the plurality of parts of the second layer or the plurality of parts of third layer are abutted against each other, whereby the angle of each of the parts of the third layer is defined. Accordingly, the angle of each of the parts of the third layer can be accurately set to a desired angle without precisely controlling the compositions and the thicknesses of the first semiconductor layer and the second semiconductor layer.

The parts of the second layer bent in at least one of the predetermined regions or the part of the third layer on the part of the second layer may be abutted against another part of the second layer or another part of the third layer.

In this case, at least one part of the second layer or third layer is abutted against another part of the second layer or another part of the third layer, whereby the angle of the part of the third layer is defined. Accordingly, the angle of the part of the third layer can be accurately set to a desired angle without precisely controlling the compositions and the thicknesses of the first semiconductor layer and the second semiconductor layer.

A method of fabricating a semiconductor device according to another aspect of the present invention comprises the steps of forming a first layer on a substrate; forming on the first layer a second layer including a stacked structure of a first semiconductor layer having a first lattice constant and a second semiconductor layer having a second lattice constant smaller than the first lattice constant; forming a third layer on the second layer; removing the third layer, the second layer and the first layer in a region surrounding a predetermined region of the third layer, excluding a partial region; and selectively removing the first layer in the predetermined region and the partial region, to bend at the partial region the second layer in the predetermined region.

According to the method of fabricating the semiconductor device, the third layer, the second layer and the first layer in the region surrounding the predetermined region, excluding the partial region, are removed, and the first layer in the predetermined region and the partial region is removed. Accordingly, the second layer in the predetermined region is in a released state while being linked to the surrounding region only in the partial region. Since the lattice constant of the first semiconductor layer in the second layer is larger than the lattice constant of the second semiconductor layer, strain based on the difference in the lattice constant is induced in the second layer. Consequently, the second layer is bent so as to relax the strain. As the second layer is bent, the third layer on the second layer stands at a predetermined angle to the substrate.

The second layer is automatically bent so as to relax the strain caused by the difference in the lattice constant between the first semiconductor layer and the second semiconductor layer, whereby the third layer stands on the substrate. Therefore, the angle of the third layer can be easily and accurately controlled by adjusting the compositions and the thicknesses of the first semiconductor layer and the second semiconductor layer.

Consequently, a semiconductor device capable of accurately controlling the angle and the position of each of members constituting the standing structure as well as being easily comprised of a semiconductor layer is realized.

The method of fabricating the semiconductor device may further comprise the step of removing the third layer in the partial region. Consequently, the second layer can be easily bent at the partial region.

The step of forming the third layer may comprise the step of forming a third semiconductor layer having a lattice constant approximately equal to that of the first semiconductor layer in the second layer. In the case, the third layer is prevented from being curved, thereby forming a flat third layer standing on the substrate.

The step of forming the third layer may comprise the step of forming a third semiconductor layer having a lattice constant different from that of the first semiconductor layer in the second layer. In the case, the third layer is curved, thereby forming a third layer in the shape of a cylindrical shape standing on the substrate.

The predetermined region may include a plurality of regions, the step of removing the third layer, the second layer, and the first layer may comprise the step of removing the third layer, the second layer and the first layer in regions respectively surrounding the plurality of regions of the third layer, excluding partial regions, and the step of selectively removing the first layer may comprise the step of respectively removing the first layer in the plurality of regions and the partial regions, to bend at the respective partial regions the parts of the second layer in the plurality of regions.

In this case, the parts of the third layer stand on the substrate in the plurality of regions.

The step of selectively removing the first layer may further comprise the step of abutting the parts of the second layer, in the plurality of regions, bent at the respective partial regions or the parts of the third layer on the parts of the second layer against each other.

In this case, the plurality of parts of the second layer or the plurality of parts of the third layer are abutted against each other, whereby the angle of each of the parts of the third layer is defined. Accordingly, the angle of each of the parts of the third layer can be accurately set to a desired angle without precisely controlling the compositions and the thicknesses of the first semiconductor layer and the second semiconductor layer.

The step of selectively removing the first layer may further comprise the step of abutting the part of the second layer bent in at least one of the regions or the part of the third layer on the part of the second layer against another part of the second layer or another part of the third layer.

In this case, at least one part of the second layer or third layer is abutted against another part of the second layer or another part of the third layer, whereby the angle of the part of the third layer is defined. Accordingly, the angle of each of the parts of the third layer can be accurately set to a desired angle without precisely controlling the compositions and the thicknesses of the first semiconductor layer and the second semiconductor layer.

The step of forming the third layer may comprise the step of forming the third layer including a reflective film. In this case, a mirror standing on the substrate can be constructed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a schematic sectional view and a schematic plan view showing a method of fabricating the semiconductor device in the first embodiment of the present invention;

DESCRIPTION OF THE PREFERRED EMBODIMENTS

FIGS. 1, 2, 3, and 4 are diagrams showing the steps of a method of fabricating a semiconductor device in a first embodiment of the present invention, where (a) is a schematic sectional view, and (b) is a schematic plan view. The semiconductor device is a reflecting mirror device having a mirror standing almost perpendicularly on a substrate.

Figure 1:
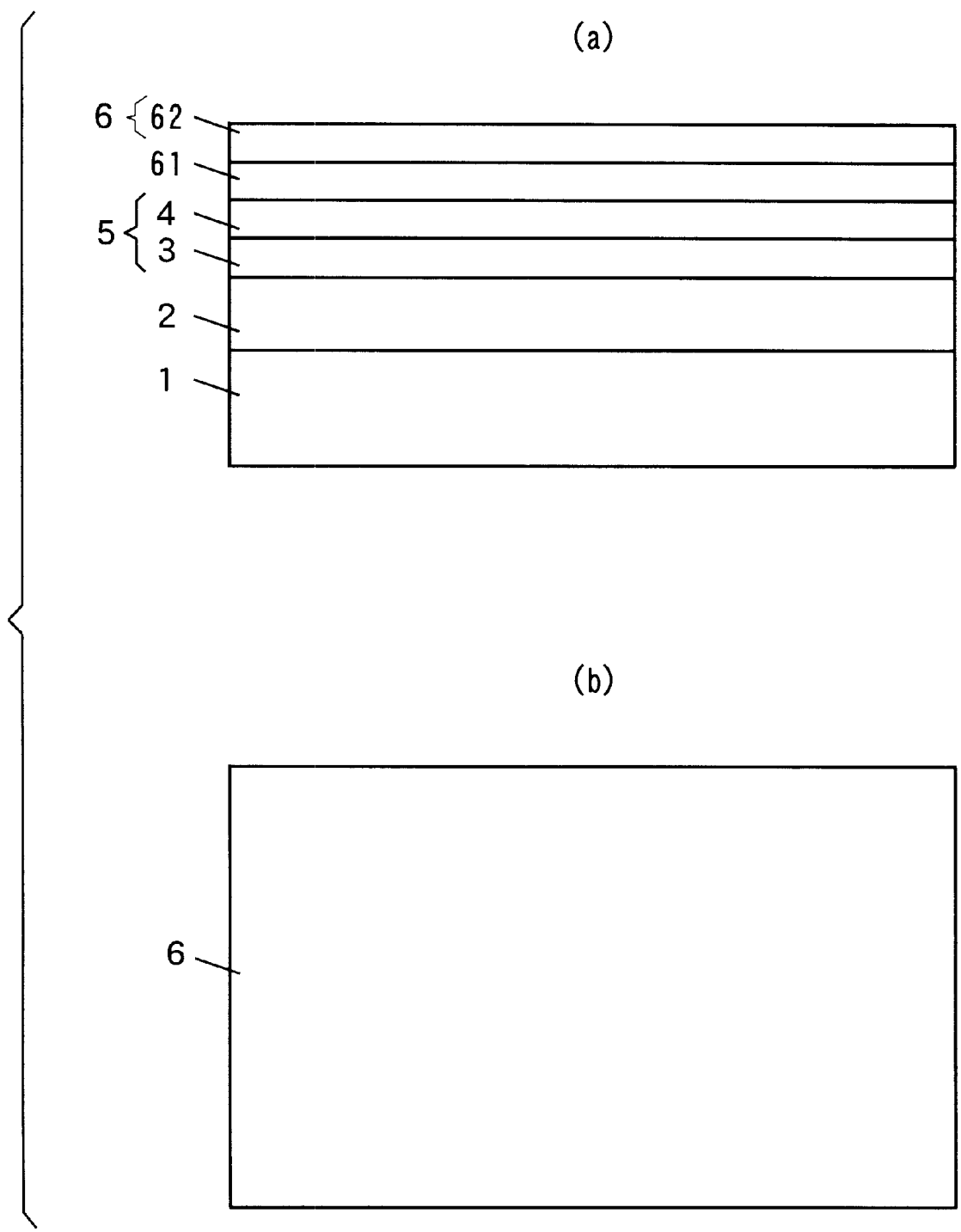
FIG. 1 is a schematic sectional view and a schematic plan view showing a method of fabricating a semiconductor device in a first embodiment of the present invention.

First, as shown in FIG. 1, a release layer 2 composed of AlGaAs, a strain layer 5, and a component layer 6 are epitaxially grown in this order on a GaAs substrate 1.

The release layer 2, the strain layer 5, and the component layer 6 are formed using an epitaxial growth technique such as MBE (Molecular Beam Epitaxy), MOCVD (Metal Organic Chemical Vapor Deposition), or CVD (Chemical Vapor Deposition).

The strain layer 5 comprises an InGaAs layer 3 having a thickness of several nanometers to several tens of nanometers and a GaAs layer 4 having a thickness of several nanometers to several tens of nanometers. The lattice constant of the InGaAs layer 3 is larger than the lattice constant of the GaAs layer 4. Therefore, strain based on the difference in the lattice constant is induced in the strain layer 5.

Furthermore, the component layer 6 comprises a distributed bragg reflector (hereinafter referred to as a DBR film) 62. A strain compensation layer 61 composed of an InGaAs is formed on the lower surface of the component layer 6. The strain compensation layer 61 is provided in order to prevent the deformation of the component layer 6 stripped in the subsequent steps, and has the same thickness and the same composition as those of the InGaAs layer 3 in the strain layer 5. The DBR film 62 has a stacked structure of AlGaAs and GaAs, as described later.

Figure 2:
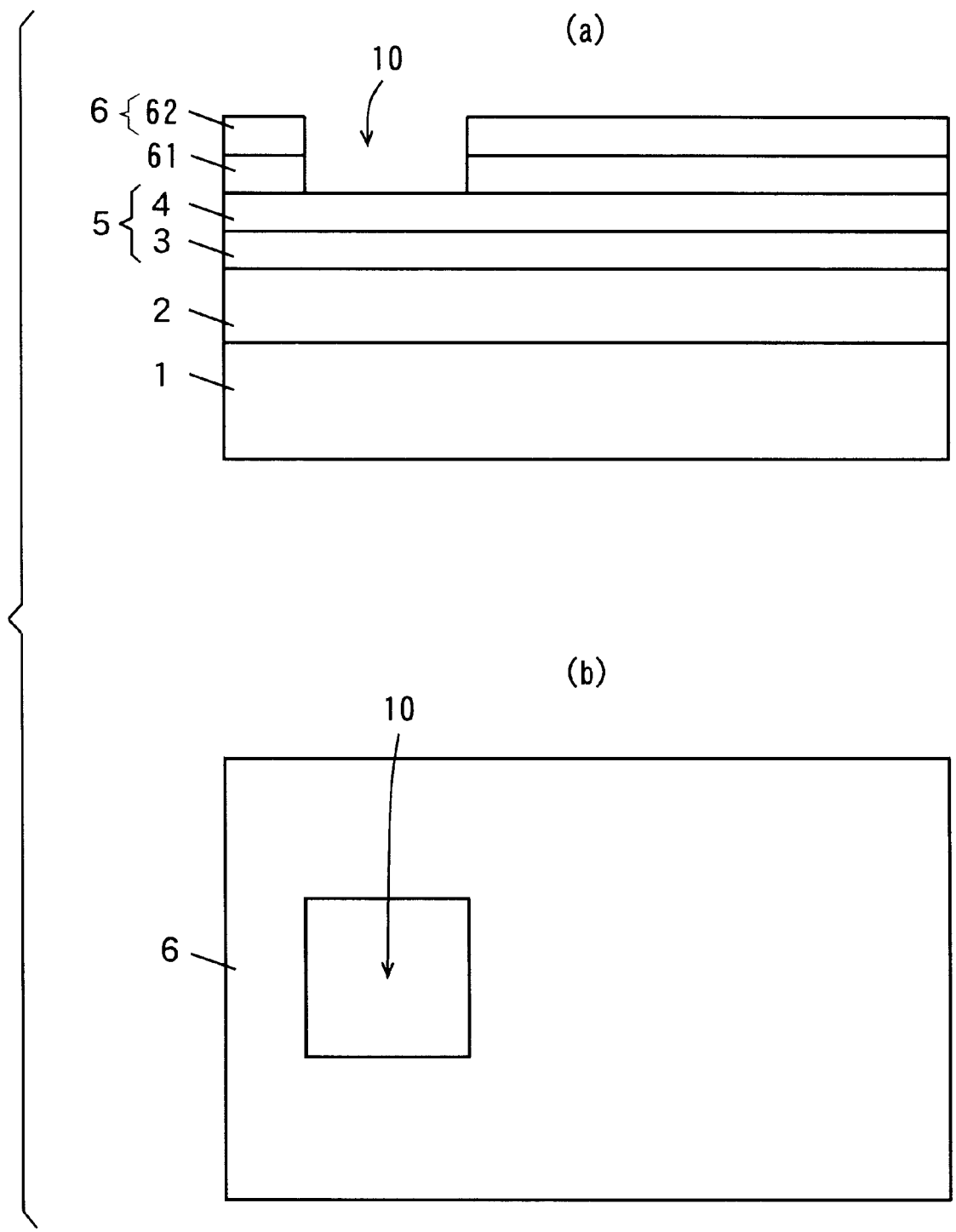
FIG. 2 is a schematic sectional view and a schematic plan view showing a method of fabricating the semiconductor device in the first embodiment of the present invention.

Then, as shown in FIG. 2, a recess 10 for defining a bent region is formed in the component layer 6 by photolithography and etching. An example of the etching is wet etching or RIE (Reactive Ion Etching).

Figure 3:
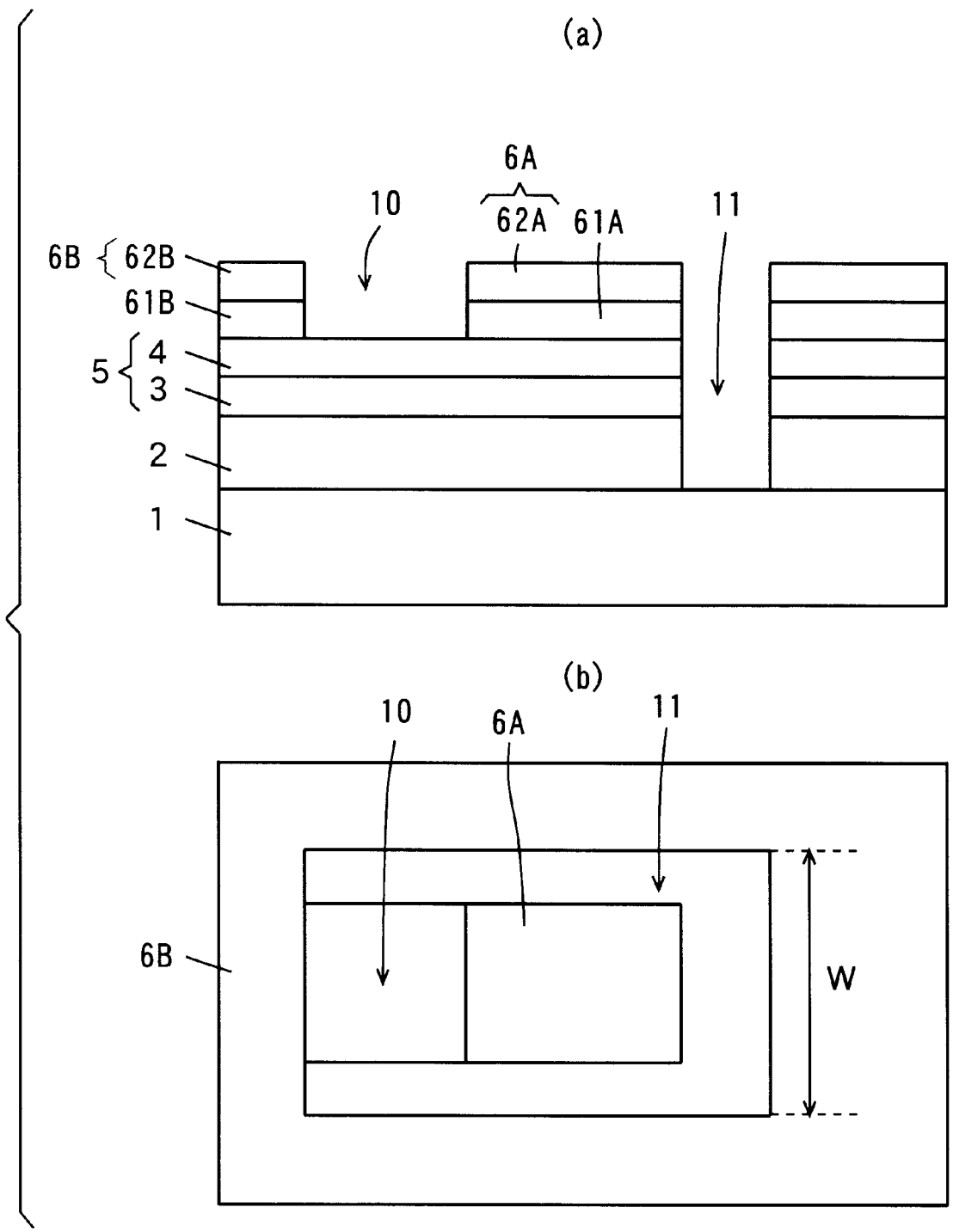
FIG. 3 is a schematic sectional view and a schematic plan view showing a method of fabricating the semiconductor device in the first embodiment of the present invention.

Then, as shown in FIG. 3, the component layer 6, the strain compensation layer 61, the strain layer 5, and the release layer 2 are removed in an approximately U shape so as to surround a predetermined region by photolithography and etching, to form a groove 11. Therefore, a DBR film 62A in a component layer 6A and a strain compensation layer 61A surrounded by the groove 11 are respectively separated from a DBR film 62B in a surrounding component layer 6B and a strain compensation layer layer 61B. The width W of a region separated by a region including the groove 11 is several tens of micrometers. Also in this case, an example of the etching is wet etching or RIE.

Thereafter, as shown in FIG. 4, the release layer 2 under the strain layer 5 is selectively etched by the wet etching. As a result, the strain layer 5 is bent at a region 12 below the recess 10 so as to relax strain caused by the difference in the lattice constant between the InGaAs layer 3 and the GaAs layer 4 which constitute the strain layer 5. In this case, the thickness of the InGaAs layer 3, the thickness of the GaAs layer 4, and the In composition ratio in the InGaAs layer 3 are most suitably selected, thereby making it possible to cause the component layer 6A to stand perpendicularly to the GaAs substrate 1.

For example, the thickness of the InGaAs layer 3 is set to 10 nm, and the thickness of the GaAs layer 4 is set to 10 nm. When the In composition ratio X in the composition $In_xGa_{1-x}As$ of the InGaAs layer 3 is set to 0.2, the strain layer 5 stands perpendicularly to the GaAs substrate 1.

The In composition ratio in the InGaAs layer 3 is changed, thereby making it possible to change the difference in the lattice constant between InGaAs and GaAs to approximately 7%.

The following relationship holds among the thickness t1 of the InGaAs layer 3, the thickness t2 of the GaAs layer 4, the In composition ratio X in the InGaAs layer 3, and the radius of curvature R of the strain layer 5:

$$R=(a/\Delta a)\cdot(d/2)$$

Here, a indicates the lattice constant of GaAs, which is 5.6533 Å. Further, $\Delta a$ indicates the difference between the lattice constant of $In_xGa_{1-x}As$ and the lattice constant of GaAs. The lattice constant of $In_{0.2}Ga_{0.8}As$ is 5.7343 Å. Further, d is the total of the thickness t1 of the InGaAs layer 3 and the thickness t2 of the GaAs layer 4. When t1=t2=10 [nm], d=20 [nm]. In this example, R=0.329 [μm].

Figure 5:
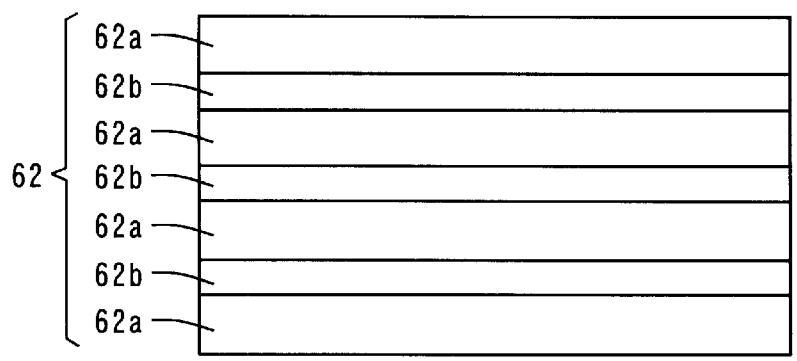
FIG. 5 is a schematic sectional view showing the detailed structure of a DBR film in the semiconductor device shown in FIGS. 1 to 4.

FIG. 5 is a schematic sectional view showing the detailed structure of the DBR film 62 in the semiconductor device shown in FIGS. 1 to 4.

As shown in FIG. 5, the DBR film 62 has a stacked structure formed by alternately stacking a plurality of AlGaAs layers 62a and a plurality of GaAs layer 62b. The period of the AlGaAs layer 62a and the GaAs layer 62b is 4 to 20.

The thickness $d_1$ of the AlGaAs layer 62a in the DBR film 62 and the thickness $d_2$ of the GaAs layer 62b therein are set, as given by the following equations:

$$d_1=\lambda/(4n_1) \quad (1)$$

$$d_2=\lambda/(4n_2) \quad (2)$$

Here, $\lambda$ indicates the light-emitting wavelength, and $n_1$ and $n_2$ respectively indicate the refractive indexes of the AlGaAs layer 62 and the GaAs layer 62b.

Generally when electromagnetic waves are incident on a material having a low refractive index from a material having a high refractive index, the phase thereof is not changed. When it is incident on a material having a high refractive index from a material having a low refractive index, the phase thereof is changed by $\pi$. When the AlGaAs layer 62a and the GaAs layer 62b satisfy the foregoing equations (1) and (2), the phases of reflected waves in the respective layers are uniform, thereby obtaining high reflectivity.

In the semiconductor device according to the present embodiment, a perpendicular mirror is comprised of the DBR film 62A.

The DBR film 62A may be constructed by alternately staking an aluminum oxide layer obtained by oxidizing AlAs and an AlGaAs layer.

A mirror comprised of the DBR film 62A standing perpendicularly to the surface of the GaAs substrate 1 is thus produced.

The semiconductor device according to the present embodiment can be fabricated easily and at low cost by a normal planar technique such as photolithography, etching, or epitaxial growth.

The strain layer 5 may be heated by causing a current to flow through the strain layer 5. Consequently, the degree of the curvature of the strain layer 5 can be adjusted, thereby making it possible to change the angle of the component layer 6A. Further, the strain layer 5 can be easily bent by thermally expanding the InGaAs layer 3. In this case, n-type or p-type impurities are doped in order to provide conductivity to the InGaAs layer 3 in the steps shown in FIG. 1.

Furthermore, the angle of the component layer 6A can be also changed to an angle other than a right angle by changing a voltage applied to the strain layer 5 or a current flowing through the strain layer 5.

Figure 6:
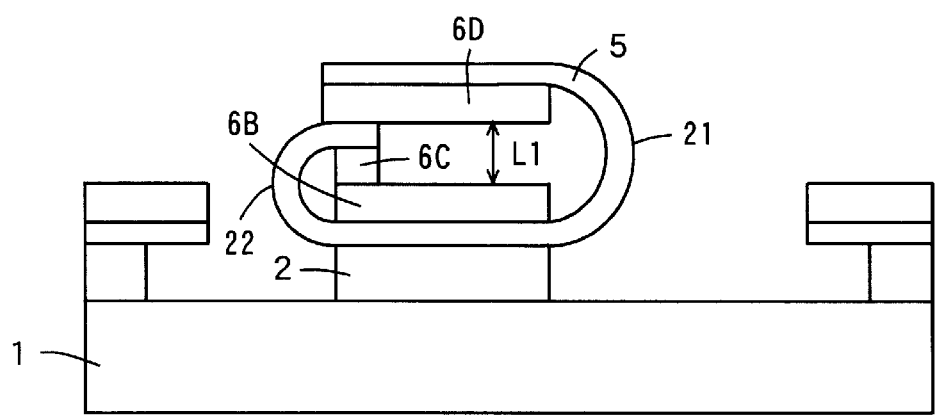
FIG. 6 is a schematic sectional view of a semiconductor device in a second embodiment of the present invention.

FIG. 6 is a schematic sectional view of a semiconductor device in a second embodiment of the present invention. The semiconductor device is a Fabry-Perot resonator having an optical axis perpendicular to a substrate.

In FIG. 6, a release layer 2 composed of AlGaAs is formed on a GaAs substrate 1, and a strain layer 5 is formed on the release layer 2. The structure of the strain layer 5 is the same as the structure of the strain layer 5 shown in FIG. 4. Parts of the strain layer 5 which project from both ends of the release layer 2 are respectively bent in a U shape upward in bent portions 21 and 22.

A component layer 6B is formed on an upper surface of a part of the strain layer 5 on the release layer 2, a component layer 6C is formed on a lower surface of one end of the strain layer 5, and a component layer 6D is formed on a lower surface of the other end of the strain layer 5. The structures of the component layers 6B, 6C, and 6D are the same as the structure of the component layer 6A shown in FIG. 4. In FIG. 6, the illustration of the strain compensation layer 61 is omitted.

The one end of the strain layer 5 and the component layer 6C are interposed between the component layer 6B and the component layer 6D. In this case, the lengths and the radii of curvature of the bent portions 21 and 22 are adjusted, whereby an upper surface of the component layer 6B and a lower surface of the component layer 6D are made parallel to each other. In this case, the distance L1 between the component layer 6B and the component layer 6D is defined by the thicknesses of the strain layer 5 and the component layer 6C.

A Fabry-Perot resonator comprising the component layer 6B and the component layer 6D is thus fabricated. The Fabry-Perot resonator has an optical axis perpendicular to the GaAs substrate 1, and has a relatively small cavity length L1 (for example, not more than approximately several micrometers) defined by the thicknesses of the strain layer 5 and the component layer 6C.

Figure 7:
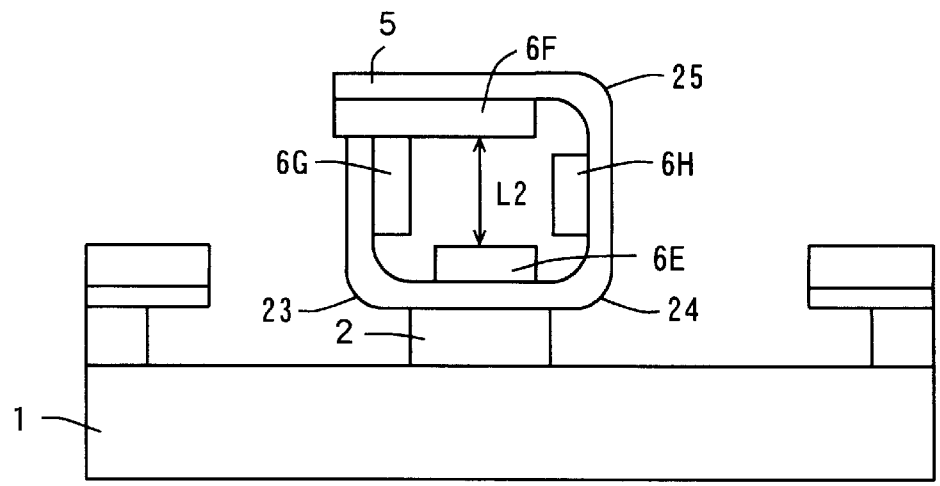
FIG. 7 is a schematic sectional view of a semiconductor device in a third embodiment of the present invention.

FIG. 7 is a schematic sectional view of a semiconductor device in a third embodiment of the present invention. The semiconductor device is a Fabry-Perot resonator having an optical axis perpendicular to a substrate.

In FIG. 7, a release layer 2 composed of AlGaAs is formed on a GaAs substrate 1, and a strain layer 5 is formed on the release layer 2. The structure of the strain layer 5 is the same as the structure of the strain layer 5 shown in FIG. 4. An end of the strain layer 5 which projects from an end of the release layer 2 is bent upward in a bent portion 23 to perpendicularly stand. The other end of the strain layer 5 which projects from the other end of the release layer 2 is bent upward in a bent portion 24, and is bent inward in a bent portion 25 to horizontally extend.

A component layer 6E is formed on an upper surface of a part of the strain layer 5 on the release layer 2, a component layer 6G is formed on an inner surface at one standing end of the strain layer 5, a component layer 6H is formed on an inner surface at the other standing end of the strain layer 5, and a component layer 6F is formed on a lower surface at the other end of the strain layer 5. The structures of the component layers 6E, 6F, 6G, and 6H are the same as the structure of the component layer 6A shown in FIG. 4. In FIG. 7, the illustration of the strain compensation layer 61 is omitted.

A lower surface of the component layer 6F under the other end of the strain layer 5 is abutted against one end of the strain layer 5 and an end surface of the component layer 6G. In this case, the lengths and the radii of curvature of the bent portions 23, 24, and 25 and the lengths of the component layers 6G and 6H are adjusted, whereby an upper surface of the component layer 6B and a lower surface of the component layer 6D are made parallel to each other. In this case, the distance L2 between the component layer 6E and the component layer 6F is defined by the length of the component layer 6G.

A Fabry-Perot resonator comprising the component layer 6E and the component layer 6F is thus fabricated. The Fabry-Perot resonator has an optical axis perpendicular to the GaAs substrate 1, and has a relatively large cavity length L2 defined by the length of the component layer 6G.

Figure 8:
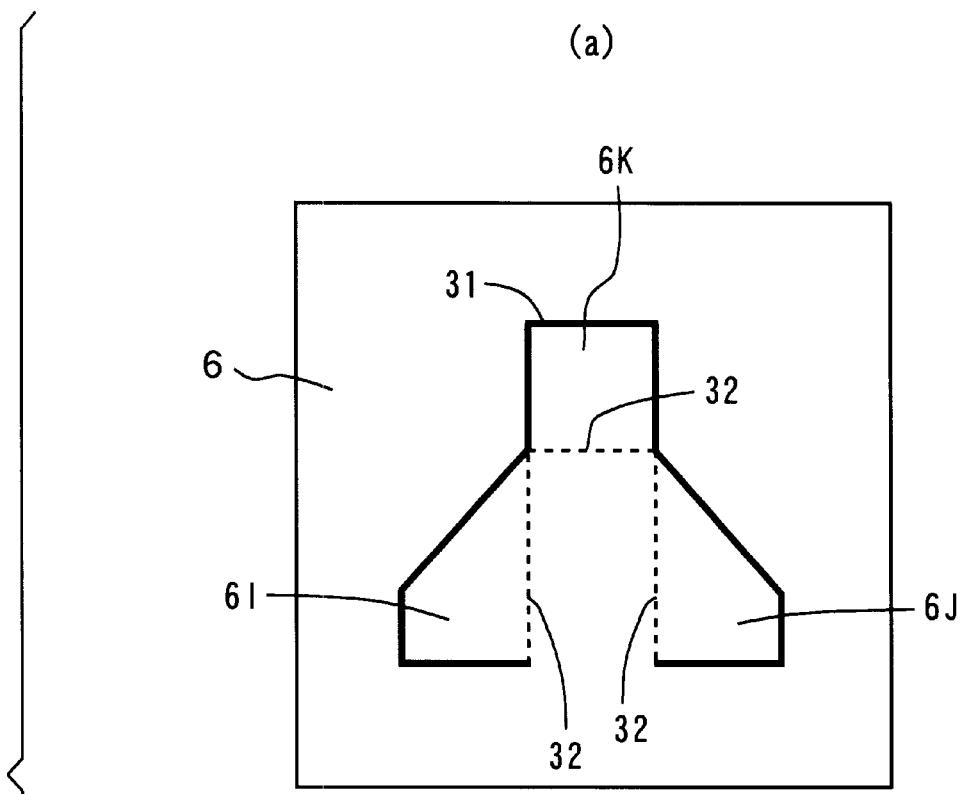
FIG. 8 is a schematic plan view and a schematic perspective view showing a method of fabricating a semiconductor device in a fourth embodiment of the present invention.
Figure 8:
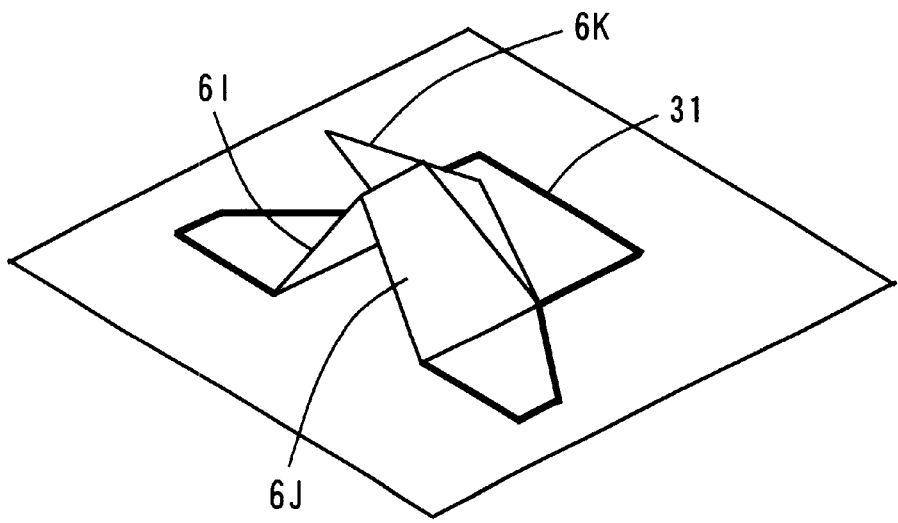

FIG. 8 is a schematic view showing a method of fabricating a semiconductor device in a fourth embodiment of the present invention. FIG. 8(a) is a plan view showing a state where a component layer has not stood yet, and FIG. 8(b) is a perspective view showing a state where the component layer has already stood. The semiconductor device has inclined surfaces fixed at predetermined angles to a substrate.

In FIG. 8, the illustration of the GaAs substrate 1, the release layer 2, the strain layer 5 and the strain compensation layer 61 shown in FIGS. 1 to 4 is omitted.

In FIG. 8(a), a groove 31 indicated by a thick solid line is formed in a component layer 6, so that component layers 6I, 6J, and 6K are separated from the remaining part of the component layer 6. The component layers 6I, 6J, and 6K are bent upward in bent portions 32 indicated by broken lines. The structures of the component layers 6I, 6J, and 6K are the same as the structure of the component layer 6A shown in FIG. 4.

Consequently, a standing structure shown in FIG. 8(b) is formed. In this case, an upper end of the component layer 6I and an upper end of the component layer 6J are abutted against each other, and one surface of the component layer 6K is abutted against respective sides of the component layers 6I and 6J. Consequently, angles of inclination of the component layers 6I and 6J are respectively defined by the sizes of the component layers 6I and 6J, and the angle of inclination of the component layer 6K is defined by the shapes of the component layers 6I and 6J. For example, the component layers 6I, 6J, and 6K are inclined at an angle of 45° to the substrate.

Consequently, the angles of inclination of the component layers 6I, 6J, and 6K can be accurately set to desired angles without precisely controlling the composition and the thickness of the a strain layer.

A semiconductor device having inclined surfaces which are fixed at predetermined angles to the substrate is thus realized.

The structures of the component layers 6I, 6J, and 6K are not limited to the structure of the component layer 6A shown in FIG. 4. For example, a layer composed of an arbitrary material can be used. For example, metal films may be used as the component layers 6I, 6J, and 6K. In the case, mirrors inclined at predetermined angles to the substrate are fabricated.

Furthermore, the shape and the number of component layers are not limited to those in the example shown in FIG. 8. A standing structure inclined at arbitrary angles to the substrate can be formed by combining component layers in arbitrary shapes and of arbitrary sizes.

Figure 9:
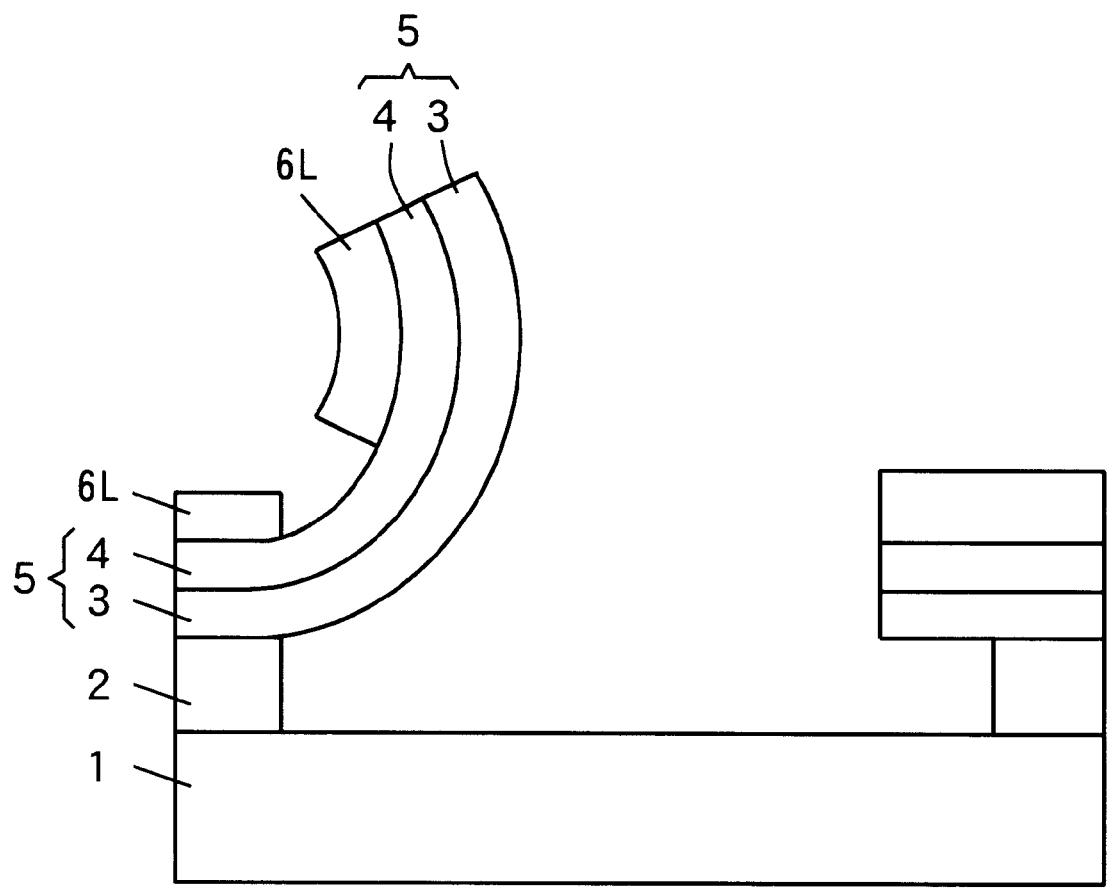
FIG. 9 is a schematic sectional view of a semiconductor device in a fifth embodiment of the present invention.

FIG. 9 is a schematic sectional view of a semiconductor device in a fifth embodiment of the present invention. The semiconductor device is a reflecting mirror device having a cylindrical mirror standing on a substrate.

In the semiconductor device shown in FIG. 9, the structure of a component layer 6L differs from the structure of the component layer 6A in the semiconductor device shown in FIG. 4. The component layer 6L is comprised of a DBR film, and the strain compensation layer 61A shown in FIG. 4 is not formed. Therefore, the component layer 6L is also curved in the shape of a cylindrical surface as the strain layer 5 is curved. The structures of other portions of the semiconductor device shown in FIG. 9 are the same as the structure of those of the semiconductor device shown in FIG. 4.

A cylindrical mirror standing on a surface of a GaAs substrate 1 is thus realized. When the semiconductor device is used, laser beams having an astigmatic difference which are emitted form a laser diode can be focused.

Figure 10:
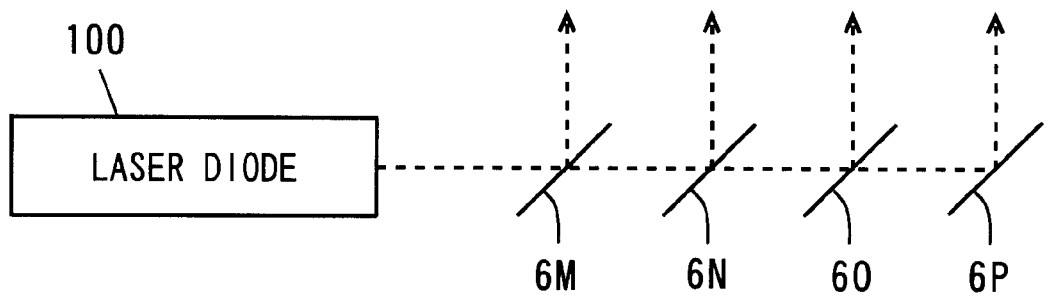
FIG. 10 is a schematic view of a semiconductor device in a sixth embodiment of the present invention.

FIG. 10 is a schematic view of a semiconductor device in a sixth embodiment of the present invention. The semiconductor device is an optical system for dividing a laser beam into different optical paths.

The semiconductor device shown in FIG. 10 is constructed by being combined with the semiconductor device shown in FIG. 8. Also in FIG. 10, the illustration of a GaAs substrate 1, a release layer 2, a strain layer 5, and a strain compensation layer 61 is omitted, as in FIG. 8.

A plurality of component layers 6M, 6N, 6O, and 6P are arranged ahead of a laser diode 100. The component layers 6M, 6N, and 6O are half mirrors for reflecting the half of incident light and transmitting the remaining half thereof, and the component layer 6P is a full reflection mirror for totally reflecting incident light.

The half of a laser beam emitted from the laser diode 100 is reflected on the component layer 6M, and the remaining half thereof transmits the component layer 6M. The half of the laser beam which transmits the component layer 6M is reflected on the component layer 6N, and the remaining half thereof transmits the component layer 6N. The half of the laser beam which transmits the component layer 6N is reflected on the component layer 6O, and the remaining half thereof transmits the component layer 6O. All the laser beams which have transmitted the component layer 6O are reflected on the component layer 6P.

The laser beam emitted from the laser diode 100 is thus divided into four optical paths by reducing the amount of light thereof by one-half, one-fourth, one-eighth, and one-sixteenth.

Figure 11:
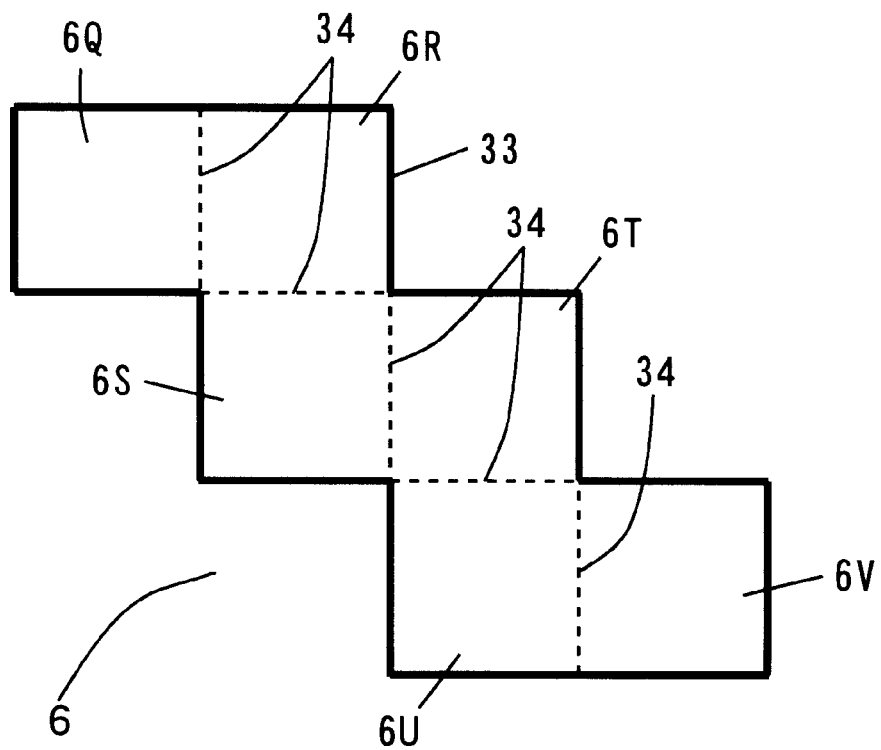
FIG. 11 is a plan view showing a state where a component layer in a semiconductor device in a seventh embodiment of the present invention has not stood yet.

FIG. 11 is a plan view showing a state where a component layer in a semiconductor device in a seventh embodiment of the present invention has not stood yet. The semiconductor device has a polyhedral structure.

Also in FIG. 11, the illustration of the GaAs substrate 1, the release layer 2, the strain layer 5, and the strain compensation layer 61 shown in FIG. 4 is omitted.

In FIG. 11, a groove 33 indicated by a thick solid line is formed in a component layer 6, whereby square component layers 6Q, 6R, 6S, 6T, 6U, and 6V are separated from the remaining part of the component layer 6. The length of one side of each of the component layers 6Q, 6R, 6S, 6T, 6U, and 6V is approximately several tens of micrometers, for example. The component layers 6Q, 6R, 6S, 6T, 6U, and 6V are bent upward at a bent portion 34 indicated by broken lines.

In this case, each of sides of the component layers 6Q, 6R, 6S, 6T, 6U, and 6V is abutted against another component layer. Consequently, the adjacent component layers 6Q, 6R, 6S, 6T, 6U, and 6V are at right angles to each other. Consequently, an accurate cube is realized without controlling the composition and the thickness of a strain layer.

Although in the above-mentioned embodiment, description was made of an example in which the strain layer 5 is bent upward, the strain layer can be bent downward, and the component layer can be caused to stand downward when the substrate, the release layer, the strain layer, and the component layer are arranged in the reversed order. Further, when the substrate, the release layer, the strain layer, and the component layer are perpendicularly arranged, the strain layer can be bent sideward, and the component layer can be caused to stand sideward.

The shape and the number of component layers are not limited to those in the example shown in FIG. 11. Various polyhedra can be constructed by combining component layers in an arbitrary number and in an arbitrary shape.

Although in the above-mentioned embodiment, a stacked structure of an InGaAs layer and a GaAs layer is used as a strain layer, the present invention is not limited to the same. Various semiconductor layers having different lattice constants can be used. A stacked structure of other Group III–V compound semiconductors or a stacked structure of Group II–VI compound semiconductors may be used as the strain layer 5. Further, a stacked structure of semiconductor layers including Si (silicon) and Ge (germanium) may be used as the strain layer and $SiO_2$ for the release layer.

Although in the above-mentioned embodiments, a GaAs substrate is used, another substrate such as an Si substrate maybe used in consideration of materials for the release layer, the strain layer, and the component layer.

Although in the above-mentioned embodiments, AlGaAs is used as the material for the release layer, the present invention is not limited. Another material may be used in consideration of selective etching.

Although the material for the component layer is not limited to that in the above-mentioned embodiment. An arbitrary material can be used depending on the use of the component layer.

The semiconductor device according to the present invention is applicable to various optical devices such as mirrors, multiplex mirrors, half mirrors, gratings, optical resonators, and optical benches. The semiconductor device according to the present invention is also applicable to optical systems using light emitting diodes, laser diodes, VCSELs (Vertical Cavity Surface Emitting Lasers), optical detectors, optical modulators, or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a substrate, a first layer, a second layer, and a third layer in this order, said second layer including a stacked structure of a first semiconductor layer having a first lattice constant and a second semiconductor layer having a second lattice constant smaller than said first lattice constant, said third layer, said second layer and said first layer in a region surrounding a predetermined region of said third layer, excluding a partial region, being removed, said first layer in said predetermined region and said partial region being removed, and said second layer in said predetermined region being bent at said partial region.

2. The semiconductor device according to claim 1, wherein said third layer in said partial region is removed.

3. The semiconductor device according to claim 1, wherein said third layer includes a first semiconductor layer having a lattice constant approximately equal to that of said first semiconductor layer in said second layer.

4. The semiconductor device according to claim 1, wherein said third layer includes a second semiconductor layer having a lattice constant different from that of said first semiconductor layer in said second layer.

5. The semiconductor device according to claim 1, wherein said third layer on said second layer, in said predetermined region, bent at said partial region has a flat surface.

6. The semiconductor device according to claim 1, wherein said third layer, on said second in said predetermined region, bent at said partial region has a cylindrical surface.

7. The semiconductor device according to claim 1, wherein said predetermined region includes a plurality of regions, the parts of said second layer respectively bent in said plurality of regions or the parts of said third layer on the parts of said second layer being abutted against each other.

8. The semiconductor device according to claim 1, wherein said third layer includes a reflective film.

9. The semiconductor device according to claim 1, wherein said first layer is a release layer, said second layer is a strain layer, and said third layer includes a component layer.

10. A semiconductor device comprising a substrate, a first layer, a second layer, and a third layer in this order, said second layer including a stacked structure of a first semiconductor layer having a first lattice constant and a second semiconductor layer having a second lattice constant smaller than said first lattice constant, said third layer, said second layer and said first layer in regions respectively surrounding a plurality of predetermined regions of said third layer, excluding partial regions, being removed, said first layer in said plurality of predetermined regions and said respective partial regions being removed, and said second layer in said plurality of predetermined regions being bent at said respective partial regions.

11. The semiconductor device according to claim 10, wherein said third layer in said respective partial regions is removed.

12. The semiconductor device according to claim 10, wherein the parts of said second layer, in said plurality of predetermined regions, bent at said respective partial regions or the parts of said third layer on the parts of the second layer are abutted against each other.

13. The semiconductor device according to claim 10, wherein the parts of said second layer bent in at least one of the predetermined regions or the part of said third layer on the part of said second layer is abutted against another part of said second layer or another part of said third layer.

* * * * *